(12) United States Patent
Liu

(10) Patent No.: US 11,894,505 B2
(45) Date of Patent: Feb. 6, 2024

(54) DISPLAY DEVICE AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Junling Liu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 534 days.

(21) Appl. No.: 17/057,091

(22) PCT Filed: Oct. 21, 2020

(86) PCT No.: PCT/CN2020/122453
§ 371 (c)(1),
(2) Date: Nov. 19, 2020

(87) PCT Pub. No.: WO2022/047913
PCT Pub. Date: Mar. 10, 2022

(65) Prior Publication Data
US 2022/0310873 A1  Sep. 29, 2022

(30) Foreign Application Priority Data

Sep. 2, 2020 (CN) .................... 202010907316.4

(51) Int. Cl.
*H01L 33/62* (2010.01)
*H01L 33/00* (2010.01)
*H01L 33/10* (2010.01)

(52) U.S. Cl.
CPC ............ *H01L 33/62* (2013.01); *H01L 33/005* (2013.01); *H01L 33/10* (2013.01); *H01L 2933/0066* (2013.01)

(58) Field of Classification Search
CPC ....... H01L 33/46; H01L 33/005; H01L 33/10; H01L 33/62; H01L 2933/0066
See application file for complete search history.

(56) References Cited

U.S. PATENT DOCUMENTS

2016/0027983 A1  1/2016  Jang et al.
2016/0093784 A1*  3/2016  Kawano ................ H01L 33/486
                                                362/382
(Continued)

FOREIGN PATENT DOCUMENTS

CN  103390713 A  11/2013
CN  206210843 U   5/2017
(Continued)

OTHER PUBLICATIONS

International Search Report in International application No. PCT/CN2020/122453, dated Jun. 7, 2021.
(Continued)

*Primary Examiner* — Feifei Yeung Lopez
(74) *Attorney, Agent, or Firm* — PV IP PC; Wei Te Chung; Zhigang Ma

(57) ABSTRACT

The present disclosure provides a display device and a manufacturing method thereof. The display device includes: a substrate; a conductive layer disposed on the substrate; and a reflective layer disposed on the conductive layer; wherein a plurality of flask-shaped holes are disposed in the reflective layer and part of the conductive layer, and a depth of each of the flask-shaped holes is greater than a thickness of the reflective layer.

15 Claims, 3 Drawing Sheets

(56) References Cited

U.S. PATENT DOCUMENTS

| | | | | |
|---|---|---|---|---|
| 2018/0198044 A1* | 7/2018 | Leirer | ................... | H01L 33/486 |
| 2021/0184090 A1* | 6/2021 | Kim | ....................... | H01L 33/62 |
| 2022/0359784 A1* | 11/2022 | Song | ...................... | H01L 33/62 |

FOREIGN PATENT DOCUMENTS

| | | | |
|---|---|---|---|
| CN | 106935607 A | | 7/2017 |
| CN | 109757120 A | | 5/2019 |
| CN | 109964323 A | | 7/2019 |
| KR | 20190051426 A | | 5/2019 |
| WO | WO2019112250 A1 | * | 3/2019 |

OTHER PUBLICATIONS

Written Opinion of the International Search Authority in International application No. PCT/CN2020/122453, dated Jun. 7, 2021.
Chinese Office Action issued in corresponding Chinese Patent Application No. 202010907316.4 dated Jun. 24, 2021, pp. 1-7.

* cited by examiner

DISPLAY DEVICE AND MANUFACTURING METHOD THEREOF

RELATED APPLICATIONS

This application is a Notional Phase of PCT Patent Application No. PCT/CN2020/122453 having international filing date of Oct. 21, 2020, which claims the benefit of priority of Chinese Patent Application No. 202010907316.4 filed on Sep. 2, 2020. The contents of the above applications are all incorporated by reference as if fully set forth herein in their entirety.

FIELD OF INVENTION

The present disclosure relates to the field of mini-LED or micro-LED backlight display technology, in particular to a display device with a mini-LED or micro-LED backlight and a manufacturing method thereof.

BACKGROUND OF INVENTION

Mini-light emitting diode (mini-LED) is a product of a combination of micro-light emitting diode (micro-LED) and a back plate. The mini-LED has characteristics such as high contrast and high color rendering performance, which are comparable to organic light-emitting diode (OLED), while cost of the mini-LED is slightly higher than that of liquid crystal display (LCD) and about 60% of the OLED. Compared to the micro-LED and the OLED, the mini-LED is easier to implement, and thus the mini-LED has become a hot spot in layouts of major panel manufacturers.

Production process of a mini-LED backlight is: glass substrate production→white oil process→surface mounted technology (SMT)→chip on film bonding (COF bonding)→splicing and modules, etc. Wherein, the purpose of the SMT is to transfer LEDs to the glass substrate one by one. The process of the SMT can be divided into: cleaning→printing joint→LED attachment→reflow soldering→testing→rework, etc. In the prior art, the SMT is merely suitable to a first type of metals with good adhesion to the joint, such as copper (Cu), silver (Ag), gold (Au), etc., however, such materials are expensive and limited in variety. When facing a second type of metals such as aluminum (AL), molybdenum (Mo), and titanium (Ti), oxide layers are easily formed on the surfaces during or before reflow soldering, and such metals have high melting points, are stable, and are difficult to infiltrate and diffuse. At this time, solder paste forms solder balls, which are easy to flow, thereby causing light-emitting devices to shift or fall off.

Technical Problem

The SMT process in the prior art has a technical problem that light-emitting devices easily shift or fall off when facing the second type of metals, which leads to a technical problem that the existing SMT is not widely applicable to conductive materials.

SUMMARY OF INVENTION

An embodiment of the present disclosure provides to a display device and a manufacturing method thereof, which is used to solve the problem that light emitting devices easily shift or fall off when facing the second type of metals in the prior art, which leads to the technical problem that the existing SMT is not widely applicable to conductive materials.

To solve the above problem, in the first aspect, the present disclosure provides a display device, wherein the display device comprises:

A substrate;
A conductive layer disposed on the substrate; and
A reflective layer disposed on the conductive layer;
Wherein, a plurality of flask-shaped holes are disposed in the reflective layer and part of the conductive layer, and a depth of each of the flask-shaped holes is greater than a thickness of the reflective layer.

In some embodiments of the present disclosure, each of the flask-shaped holes comprises an arc-shaped bottom portion and a cylindrical portion connected to the arc-shaped bottom portion, the arc-shaped bottom portion is disposed in the conductive layer, and the cylindrical portion penetrates the reflective layer.

In some embodiments of the present disclosure, a projection area of the arc-shaped bottom portion projected on the substrate is greater than a projection area of the cylindrical portion projected on the substrate.

In some embodiments of the present disclosure, the conductive layer comprises a first conductive layer and a second conductive layer stacked in sequence, the second conductive layer is disposed away from a surface of a side of the substrate and disposed between the reflective layer and the first conductive layer.

In some embodiments of the present disclosure, the display device further comprises a joint and a light-emitting device, the joint is disposed on the reflective layer and fills the cylindrical portion, the light-emitting device is disposed on the joint and electrically connects to the conductive layer through the joint.

In some embodiments of the present disclosure, the joint includes a plurality of joint particles, sizes of the joint particles range from 5 um to 50 um.

In some embodiments of the present disclosure, a diameter of the cylindrical portion is greater than particle sizes of the joint, the maximum width of the cylindrical portion ranges from 1 um to 500 um; a thickness of the reflective layer is greater than the particle sizes of the joint, and the thickness of the reflective layer ranges from 1 um to 200 um.

In some embodiments of the present disclosure, material of the conductive layer is one or a combination of Cu, Ag, Au, Ti, and Mo.

In the second aspect, the present disclosure provides a manufacturing method of a display device, the manufacturing method is used to manufacture any one of the display device disclosed in the first aspect, and comprises the following steps:

Providing a substrate, and forming a conductive layer on the substrate;

Forming a reflective layer on the conductive layer, and forming a plurality of cylindrical holes in the reflective layer;

Forming holes with arc-shaped bottom portions in the conductive layer, and each of the holes with arc-shaped bottom portions is connected to one of the cylindrical holes to form a flask-shaped hole, in order to obtain a display device.

In some embodiments of the present disclosure, the manufacturing method further comprises forming a joint in the flask-shaped holes and attaching a light emitting device on a surface of the joint, wherein an inkjet printing method or a printing method is adopted to form the reflective layer, a printing method is adopted to form the joint, and a wet etching method, a dry etching method or a laser etching method is adopted to form the flask-shaped holes.

In some embodiments of the present disclosure, forming each of the flask-shaped holes comprises forming an arc-shaped bottom portion and a cylindrical portion connected to the arc-shaped bottom portion, the arc-shaped bottom portion is disposed in the conductive layer, and the cylindrical portion penetrates the reflective layer.

In some embodiments of the present disclosure, a projection area of the arc-shaped bottom portion projected on the substrate is greater than a projection area of the cylindrical portion projected on the substrate.

In some embodiments of the present disclosure, forming the conductive layer comprises preparing a first sub-conductive layer and a second sub-conductive layer stacked in sequence, the second sub-conductive layer is disposed away from a surface of a side of the substrate, and disposed between the reflective layer and the first sub conductive layer.

In some embodiments of the present disclosure, the manufacturing method comprises forming a joint and a light-emitting device, the joint is disposed on the reflective layer and fills the flask-shaped holes, the light-emitting device is disposed on the joint and electrically connects to the conductive layer through the joint.

In some embodiments of the present disclosure, the joint includes a plurality of joints particles, sizes of the joint particles range from 5 um to 50 um.

In some embodiments of the present disclosure, a diameter of the cylindrical portion is greater than particle sizes of the joint, and the maximum width of the cylindrical portion ranges from 1 um to 500 um, a thickness of the reflective layer is greater than the particle sizes of the joint, and the thickness of the reflective layer ranges from 1 um to 200 um.

In some embodiments of the present disclosure, material adopted when forming the conductive layer comprises one or a combination of Cu, Ag, Au, Al, Ti, and Mo.

BENEFICIAL EFFECT

Compared with display devices in the prior art, in the present disclosure, a plurality of flask-shaped holes are disposed in the reflective layer and part of the conductive layer, so that the joint penetrates into the flask-shaped holes, and physically connected joint embedment is formed between the cured joint and the film structure, which greatly improves the stability of the joint, thereby improving the insufficient adhesion between the joint and the conductive layer, and preventing the problem that positions of the light-emitting devices easily shift or fall off relative to the conductive layer, and further improving the reliability of welding in the SMT process, and improving the production yield and product quality.

DESCRIPTION OF DRAWINGS

In order to more clearly explain technical solutions in embodiments of the present disclosure, the following will briefly introduce drawings required in the description of the embodiments. Obviously, the drawings in the following description are only some embodiments of the present disclosure. For those skilled in the art, without paying any creative work, other drawings can be obtained based on these drawings.

DETAILED DESCRIPTION OF PREFERRED EMBODIMENTS

Figure 1:
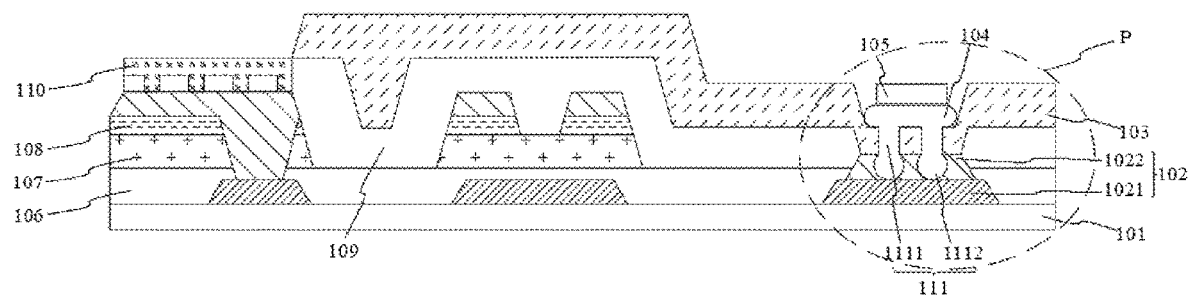
FIG. 1 is a schematic structural diagram of a display device in an embodiment of the present disclosure.

Technical solutions in embodiments of the present disclosure will be clearly and completely described below in conjunction with drawings in the embodiments of the present disclosure. It is clear that the described embodiments are part of embodiments of the present disclosure, but not all embodiments. Based on the embodiments of the present disclosure, all other embodiments to those of ordinary skill in the premise of no creative efforts obtained, should be considered within the scope of protection of the present disclosure.

In the description of the present disclosure, it should be understood that orientations or position relationships indicated by the terms "center", "longitudinal", "lateral", "length", "width", "thickness", "upper", "lower", "front", "rear", "left", "right", "vertical", "horizontal", "top", "bottom", "inside", "outside", "clockwise", and "counter-clockwise" are based on orientations or position relationships illustrated in the drawings. The terms are used to facilitate and simplify the description of the present disclosure, rather than indicate or imply that the devices or elements referred to herein are required to have specific orientations or be constructed or operate in the specific orientations. Accordingly, the terms should not be construed as limiting the present disclosure. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

In the SMT process of the prior art, light-emitting devices easily shift or fall off when facing the second type of metals, which causes a technical problem that the existing SMT is not widely appropriate to conductive materials.

Based on this, the present disclosure provides a display device and a manufacturing method thereof. Detailed descriptions are made below.

Firstly, an embodiment of the present disclosure provides a display device. As shown in FIG. 1, FIG. 1 is a schematic structural diagram of a display device in an embodiment of the present disclosure. The display device comprises: a substrate 101; a conductive layer 102 disposed on the substrate 101; a reflective layer 103 disposed on the conductive layer 102; wherein a plurality of flask-shaped holes 111 are provided in the reflective layer 103 and part of the conductive layer 102, a depth of each of the flask-shaped holes is greater than a thickness of the reflective layer 103.

The display device further comprises a joint 104 and a light-emitting device 105, the joint 104 is disposed on the reflective layer 103 and fills the flask-shaped holes 111, and the light emitting device 105 is disposed on the joint 104 and electrically connected to the conductive layer 102 through the joint 104.

Compared with a display device in the prior art, in the present disclosure, a plurality of flask-shaped holes 111 are disposed in the reflective layer 103 and part of the conductive layer 102, so that the joint 104 penetrates into the flask-shaped holes, and physically connected joint embedment is formed between the cured joint 104 and the film structure, which greatly improves stability of the joint 104, thereby improving insufficient adhesion between the joint 104 and the conductive layer 102, and preventing the problem that the position of the light emitting device 105 easily shifts or falls off relative to the conductive layer 102, and further improving reliability of welding in the SMT process, and improving production yield and product quality.

In the embodiments of the present disclosure, the light-emitting device 105 is preferably a mini-LED or a micro-LED. Compared with an existing LCD or OLED, the mini-LED or the micro-LED has advantages of fast response, high color gamut, high pixels per inch (PPI), low energy consumption, etc. The joint 104 is preferably solder paste, which includes flux and solder powder, and the solder powder includes tin-lead, tin-bismuth, tin-silver-copper alloy, and has advantages of good electrical conductivity, strong adhesion to devices, and low melting point, etc. The solder paste has a uniformly distributed particle size, usually ranging from 5 um to 50 um.

Figure 2:
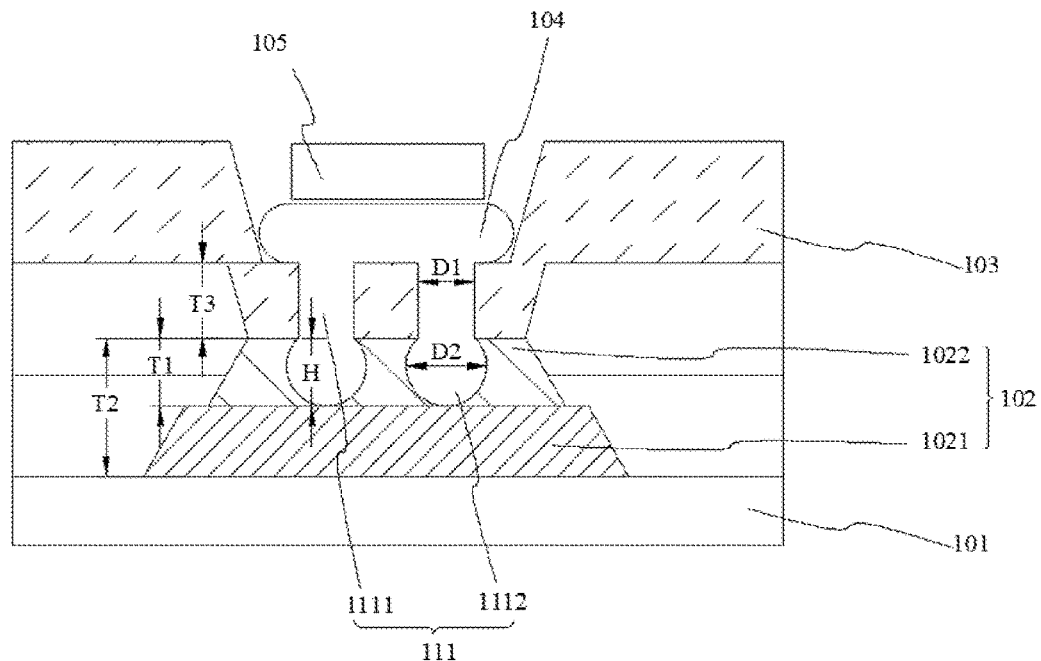
FIG. 2 is an enlarged diagram of P in FIG. 1.
Figure 3:
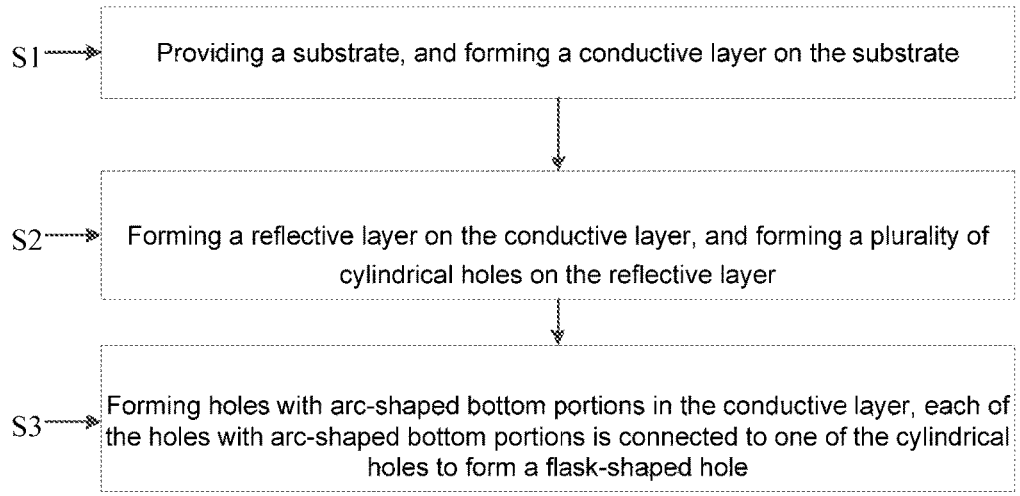
FIG. 3 is a flowchart of a manufacturing method in an embodiment of the present disclosure.

As shown in FIG. 2, FIG. 2 is an enlarged diagram of P in FIG. 1. In the embodiments of the present disclosure, each of the flask-shaped holes 111 includes an arc-shaped bottom portion 1112 and a cylindrical portion 1111 connected to the arc-shaped bottom portion, the arc-shaped bottom portion 1112 is disposed in the conductive layer 102, and the cylindrical portion 1111 penetrates the reflective layer 103. A plurality of cylindrical portions 1111 disposed in the reflective layer 103 are grid-shaped, special cross-sectional shape of each of the cylindrical portions 1111 is not limited, and may be circular, elliptical, rectangular, rhombus, etc. In the present embodiment, the cross-sectional shape of the cylindrical portion 1111 is preferably rectangular, that is, the cylindrical portions are cylinder-shaped. The cylindrical portions 1111 need to be greater than the particle size of the joint 104 in order to facilitate the entry of the joint 104. Preferably, a distance at a diameter D1 of each of the cylindrical portions 1111 ranges from 1 um to 500 um.

In order to further strengthen adhesion between the joint 104 and the conductive layer 102, holes with the arc-shaped bottom portions 1112 are disposed on a surface of a side of the conductive layer 102 close to the reflective layer 103, and each of the arc-shaped bottom portions 1112 is connected to one of the cylindrical portions 1111. Wherein, an area of the arc-shaped bottom portions 1112 projected on the substrate 101 is greater than an area of the cylindrical portions 1111 projected on the substrate 101. In the present embodiment, each of the arc-shaped bottom portions 1112 is a portion of a sphere, and correspondingly, the maximum width D2 of each of the arc-shaped bottom portions 1112 is greater than the diameter D1 of each of the cylindrical portions 1111. By setting D2>D1, the cured joint 104 will form a wider platform section that does not enter the cylindrical portions 1111 and a wider lower section at the arc-shaped bottom portions 1112, while a middle section at the cylindrical portions 1111 is narrower. Such structure of wide ends and a narrow middle section fixes the joint 104 with stronger stability.

Preferably, a cross-section of each of the arc-shaped bottom portions 1112 is a part of a circle or an ellipse, a cross-section of each of the cylindrical portions 1111 is a rectangle, and D2>D1, then a cross-section view of the middle and lower section of the joint 104 has a shape of flask with an elongated neck and a wide abdomen.

In another embodiment of the present disclosure, the conductive layer 102 comprises a first sub-conductive layer 1021 and a second sub-conductive layer 1022 stacked in sequence, the second sub-conductive layer 1022 is disposed away from a surface of a side of the substrate 101 and disposed between the reflective layer 103 and the first sub-conductive layer 1021. A depth of each of the arc-shaped bottom portions 1112 is greater than a half thickness T1 of the second sub-conductive layer 1022, and less than a thickness T2 of the entire conductive layer 102. When the depth H of each of the arc-shaped bottom portions 1112 is too shallow, the stability improvement is not obvious; however, when the depth H of each of the arc-shaped bottom portions 1112 is too deep or even penetrates the entire conductive layer 102, it will affect conduction performance of the joint 104 between the light-emitting device 105 and the conductive layer 102, thereby affecting electrical characteristics of the conductive layer 102 and the light-emitting device 105, thus ($\frac{1}{2}$T1)<H<T2 is chosen.

In the present embodiment, it is merely introduced that the conductive layer 102 includes two sub-conductive layers. It is understandable that in other embodiments, the conductive layer may also include a plurality of the sub-conductive layers, and a thickness of each of the conductive layers ranges from 1000 A to 10000 A. The depth H of each of the arc-shaped bottom portions 1112 also needs to be greater than a half thickness of the uppermost sub-conductive layer, and less than a thickness of the entire conductive layer.

Preferably, material of the conductive layer 102 is one of or a combination of Cu, Ag, Au, Al, Ti, and Mo. Material adopted by different sub-conductive layers may be the same or different, and is selected from the above mentioned materials according to actual production requirement. When the conductive layer 102 comprises two sub-conductive layers, that is, comprises the first sub-conductive layer 1021 close to the reflective layer 103 and the second sub-conductive layer 1022 close to the substrate 101, the first sub-conductive layer 1021 is usually named the second metal layer, and the second sub-conductive layer 1022 is named the first metal layer.

On the basis of the above embodiments, the reflective layer 103 is white ink, and has the function of a light shielding layer or an anti-scratch layer. In order to enable cylindrical portions 113 to accommodate the joint 104, a thickness T3 of the reflective layer 103 is greater than the particle size of the joint 104, preferably, the thickness T3 of the reflective layer 103 ranges from 1 um to 200 um.

It is worth mentioning that the display panel further comprises a gate insulating layer 106, an amorphous silicon layer 107, a phosphorus-doped amorphous silicon layer 108, a passivation layer 109, and an indium tin oxide layer 110 stacked in sequence. A flip chip film bonding process is performed at the position where the indium tin oxide layer 110 is located to fix an integrated circuit (IC) on a flexible circuit board, and the SMT process is performed at P to transfer light-emitting devices 105 one by one to pads on a side of a thin film transistor (TFT) array substrate.

In order to better manufacture the display device in the embodiment of the present disclosure, on the basis of the display device, the embodiment of the present disclosure also provides a manufacturing method of a display device, which is used to manufacture the display device as described in the above embodiments.

Figure 4A:
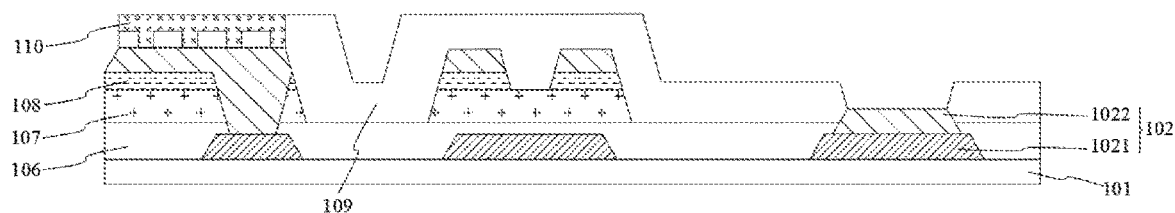
FIGS. 4A-4C are schematic diagrams of steps of the manufacturing method in an embodiment of the present disclosure.
Figure 4B:
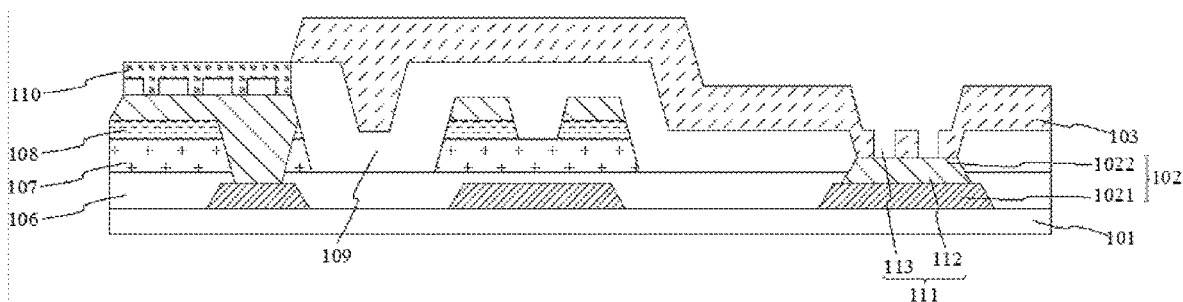
Figure 4C:
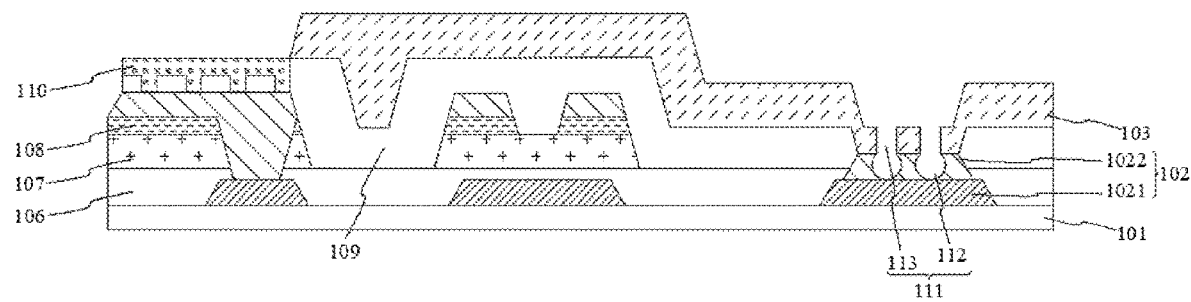

As shown in FIG. 3 and FIGS. 4A-4C, FIG. 3 is a flowchart of a manufacturing method in an embodiment of the present disclosure, and FIGS. 4A-4C are schematic diagrams of steps of a manufacturing method in an embodiment of the present disclosure. The manufacturing method comprises the following steps:

S1, a substrate 101 is provided, and a conductive layer 102 is formed on the substrate 101.

In particular, in some embodiments, the manufacturing steps further comprise processes such as cleaning, deposition, coating, exposure, development, etching, peeling, etc. The conductive layer 102, a gate insulating layer 106, an amorphous silicon layer 107, a phosphorus-doped amorphous silicon layer 108, a passivation layer 109, and an indium tin oxide layer 110 are formed on the substrate 101. The conductive layer 102 includes at least two sub-conductive layers, wherein material of the conductive layer 102 is one or a combination of copper, silver, gold, aluminum, titanium, and molybdenum, as shown in FIG. 4A.

S2, a reflective layer 103 is formed on the conductive layer 102, and a plurality of cylindrical holes 1111 are formed on the reflective layer 103.

In particular, in some embodiments, an inkjet printing method or a printing method is adopted to form a layer of white ink on the conductive layer 102 and other film layers as the reflective layer 103, and the reflective layer 103 further has the function of a light shielding layer or an anti-scratch layer. The reflective layer 103 is provided with a plurality of grid-shaped cylindrical holes 1111 where a light-emitting device 105 is to be attached, as shown in FIG. 4B.

S3, holes with arc-shaped bottom portions 1112 are formed in the conductive layer 102, and each of the holes with the arc-shaped bottom portions 1112 is connected to one of the cylindrical holes 1111 to form a flask-shaped hole 111.

Specifically, the conductive layer 102 is half-etched to form a "flask"-shaped hole with an "abdomen" larger than a "neck", as shown in FIG. 4C.

The manufacturing method further comprises: forming a joint 104 in the flask-shaped hole 111; and attaching the light-emitting device 105 on a surface of the joint 104 to obtain a display device, as shown in FIG. 1.

Wherein, preferably, the reflective layer 103 is formed by inkjet printing or printing method, the joint 104 is formed by a printing method, and the flask-shaped hole is formed by wet etching, dry etching, or laser etching.

In the above embodiment, the description of each embodiment has its own emphasis. For the part not detailed in one embodiment, please refer to the detailed description of other embodiments above, and will not repeat here. In the specific implementation, the above-mentioned units or structures can be realized as independent entities, or can be arbitrarily combined as the same or several entities. For the specific implementation of the above units, structures or operations, please refer to the previous method embodiments, and will not be repeated here.

The embodiments of the present disclosure are described in detail above, and specific examples are used to illustrate the principles and implementation of the present disclosure. The descriptions of the above examples are only used to help understand the methods and core ideas of the present disclosure. At the same time, those ordinary skill in the art, based on the ideas of the present disclosure, can changes in the specific implementation and the application scope of the present disclosure. In summary, the content of this specification should not be construed as a limitation to the present disclosure.

What is claimed is:

1. A display device, comprising:
   a substrate;
   a conductive layer disposed on the substrate, the conductive layer comprising a plurality of sub-conductive layers stacked in sequence; and
   a reflective layer disposed on the conductive layer;
   wherein a plurality of flask-shaped holes are disposed in the reflective layer and part of the conductive layer,
   each of the flask-shaped holes comprises an arc-shaped bottom portion and a cylindrical portion connected to the arc-shaped bottom portion, the arc-shaped bottom portion is disposed in the conductive layer, and the cylindrical portion penetrates the reflective layer, and
   a depth of the arc-shaped bottom portion is greater than half of a thickness of an uppermost one of the sub-conductive layers and less than a thickness of the conductive layer.

2. The display device of claim 1, wherein a projection area of the arc-shaped bottom portion projected on the substrate is greater than a projection area of the cylindrical portion projected on the substrate.

3. The display device of claim 1, wherein the sub-conductive layers comprise a first sub-conductive layer and a second sub-conductive layer stacked in sequence, and the second sub-conductive layer is disposed between the reflective layer and the first sub-conductive layer.

4. The display device of claim 1, wherein the display device further comprises a joint and a light-emitting device, the joint is disposed on the reflective layer and fills the flask-shaped holes, and the light-emitting device is disposed on the joint and is electrically connected to the conductive layer through the joint.

5. The display device of claim 4, wherein the joint includes a plurality of joint particles, and a size of each of the joint particles ranges from 5 µm to 50 µm.

6. The display device of claim 4, wherein a diameter of the cylindrical portion is greater than a particle size of the joint, a maximum width of the cylindrical portion ranges from 1 µm to 500 µm a thickness of the reflective layer is greater than the particle size of the joint, and the thickness of the reflective layer ranges from 1 µm to 200 µm.

7. The display device of claim 1, wherein material of the conductive layer is one or a combination of Cu, Ag, Au, Ti, and Mo.

8. A manufacturing method of a display device, comprising:
   providing a substrate, and forming a conductive layer comprising a plurality of sub-conductive layers stacked in sequence on the substrate;
   forming a reflective layer on the conductive layer, and forming a plurality of cylindrical holes in the reflective layer; and
   forming holes with arc-shaped bottom portions in the conductive layer, and connecting each of the holes with the arc-shaped bottom portions to one of the cylindrical holes to form a flask-shaped hole, wherein the flask-shaped hole comprises an arc-shaped bottom portion of the arc-shaped bottom portions and a cylindrical portion that is formed of one of the cylindrical holes and connected to the arc-shaped bottom portion, the cylindrical portion penetrates the reflective layer, and a depth of the arc-shaped bottom portion is greater than half of a thickness of an uppermost one of the sub-conductive layers and less than a thickness of the conductive layer.

9. The manufacturing method of claim 8, wherein the manufacturing method further comprises forming a joint in the flask-shaped hole and attaching a light-emitting device to a surface of the joint, wherein an inkjet printing method or a printing method is adopted to form the reflective layer, a printing method is adopted to form the joint, and a wet etching method, a dry etching method, or a laser etching method is adopted to form the flask-shaped hole.

10. The manufacturing method of claim 8, wherein a projection area of the arc-shaped bottom portion projected on the substrate is greater than a projection area of the cylindrical portion projected on the substrate.

11. The manufacturing method of claim 8, wherein the sub-conductive layers comprise a first sub-conductive layer and a second sub-conductive layer stacked in sequence, and the second sub-conductive layer is and disposed between the reflective layer and the first sub-conductive layer.

12. The manufacturing method of claim 8, wherein the manufacturing method further comprises forming a joint and a light-emitting device, the joint is disposed on the reflective layer and fills the flask-shaped hole, and the light-emitting device is disposed on the joint and electrically connects to the conductive layer through the joint.

13. The manufacturing method of claim 12, wherein the joint includes a plurality of joint particles, and a size of each of the joint particles ranges from 5 μm to 50 μm.

14. The manufacturing method of claim 12, wherein a diameter of the cylindrical portion is greater than a particle size of the joint, a maximum width of the cylindrical portion ranges from 1 μm to 500 μm, a thickness of the reflective layer is greater than the particle size of the joint, and the thickness of the reflective layer ranges from 1 μm to 200 μm.

15. The manufacturing method of claim 8, wherein material adopted when forming the conductive layer comprises one or a combination of Cu, Ag, Au, Al, Ti, and Mo.

\* \* \* \* \*